United States Patent [19]

Gfeller et al.

[11] Patent Number: 5,280,535
[45] Date of Patent: Jan. 18, 1994

[54] SEMICONDUCTOR LASER DIODE DEPOSITED ON A STRUCTURED SUBSTRATE SURFACE

[75] Inventors: Fritz Gfeller, Rueschlikon; Heinz Jaeckel, Kilchberg; Heinz Meier, Thalwil, all of Switzerland

[73] Assignee: International Business Machines Corporation, Armonk, N.Y.

[21] Appl. No.: 985,414

[22] Filed: Dec. 4, 1992

[30] Foreign Application Priority Data

Dec. 5, 1991 [EP] European Pat. Off. ........... 91810943

[51] Int. Cl.$^5$ ............................................. H01S 3/19
[52] U.S. Cl. ........................................ 372/46; 372/45; 372/48
[58] Field of Search ...................... 372/46, 45, 43, 48

[56] References Cited

U.S. PATENT DOCUMENTS

| | | | |
|---|---|---|---|
| 4,785,457 | 11/1988 | Asbeck et al. | 372/45 |
| 4,831,630 | 5/1989 | Seifres et al. | 372/50 |
| 4,839,307 | 6/1989 | Imanaka et al. | 437/129 |
| 4,932,033 | 6/1990 | Miyazawa et al. | 372/46 |

FOREIGN PATENT DOCUMENTS

| | | |
|---|---|---|
| 0069563 | 2/1982 | European Pat. Off. . |
| 3604293 | 2/1986 | European Pat. Off. . |
| 0261262 | 9/1986 | European Pat. Off. . |
| 0332723 | 3/1988 | European Pat. Off. . |
| 0363547 | 9/1988 | European Pat. Off. . |

OTHER PUBLICATIONS

"Channelled substrate (100) GaAs MBE growth and lateral p-n junction formation of lasers" by H. Meier et al., Inst. Phys. Conf. Ser. No. 91, Ch.

"High-power fundamental mode AlGaAs quantum well channeled substrate laser grown by molecular beam epitaxy", by H. Jaeckel et al., Appl. Phys. Lett. 55 (11), Sep. 11, 1989.

"Lateral p-n junction formation in GaAs molecular beam epitaxy by crystal plane dependent doping", by D. L. Miller, 320 Applied Physics Letters 47 (Dec. 15, 1985), No. 12.

"High-power Ridge-waveguide AlGaAs Grin-sch Laser Diode," Electronics Letters, Sep. 25, 1986, vol. 22, No. 20, pp. 1081-1082.

"Semiconductor Laser Element" by Y. Kashiwada, Patent Abstracts of Japan, vol. 9, No. 165 (E-327) (1988), Jul. 10, 1985.

*Primary Examiner*—Georgia Y. Epps
*Attorney, Agent, or Firm*—Michael J. Balconi-Lamica

[57] ABSTRACT

A semiconductor laser diode comprises a waveguide formed by an active layer sandwiched in between upper and lower cladding layers, wherein the cladding layers comprise a material having a bandgap that differs from that of the active layer. The waveguide is deposited on a structured substrate having a surface pattern that causes the waveguide to be bent near its ends, i.e., near cleaved or etched facets of the completed laser device thereby providing a non-absorbing mirror (NAM) window structure. A laser beam, generated in the center, planar waveguide section, leaves the waveguide at the bend, continuing substantially unabsorbed and undeflected through the wider bandgap cladding layer material towards the mirror facet. An amphoteric dopant, used during growth of the layered waveguide structure, causes a reversal of the conductivity-type within the semiconductor material deposited above inclined surface regions. Thus, a junction serving as current block is formed preventing lateral currents from reaching the facet region.

8 Claims, 2 Drawing Sheets

SEMICONDUCTOR LASER DIODE DEPOSITED ON A STRUCTURED SUBSTRATE SURFACE

BACKGROUND OF THE INVENTION

1. Field of the Invention

The present invention relates to a semiconductor laser diode and, more particularly, to a semiconductor laser diode with high optical power capabilities and reliability.

2. Discussion of the Related Art

With the ever-growing importance of III-V compound semiconductor laser diodes for applications such as optical communications, printers and optical disk memory systems, there is a great demand for high reliability device providing for long lifetimes coupled with high power capabilities.

For these devices, the maximum optical output power is generally limited by catastrophic optical damage (COD) occurring due to local heating at the laser mirrors. It is thus important that the COD level can be raised by optimizing the critical mirror facet region with respect to a number of factors determining device performance such as the absorption of optical energy, the number of electric carriers and their recombination rate at the facet as well as the mirror passivation, to reduce heat development near the mirror interface.

Such optimization is of importance for the hitherto most commonly used laser diodes having cleaved mirrors but also, and even more so, for etched mirror devices to which, more recently, much attention has been directed. This mainly because of the inherent advantages of this technology which allows full wafer processing and testing and a high level of integration. A typical device and its fabrication is disclosed in European patent application 0 363 547 "Method for Etching Mirror Facets of III-V Semiconductor Structures". However, the processes required to etch, clean and passivate the etched facets tend to have a harmful effect on the mirror quality by increasing the number of surface states whereby it becomes very difficult to achieve the required performance characteristics. There is a definite need for improved high reliability high-power devices.

A non-absorbing mirror (NAM) device can be realized with a bent-waveguide structure where the optical beam is emitted through a window structure of wider bandgap material, which may be a section of a cladding layer. A rather large variety of devices incorporating this concept has already been proposed, e.g., in the following documents:

Patent Abstracts of Japan, Vol. 9, No. 105 (E-327)(1988), Jul. 10, 1985. "Semiconductor Laser Element".

EP-A-0 332 723 "High-Power Semiconductor Diode Laser".

DE-A-3 604 293 "Heterostruktur-Halbleiterlaserdiode".

EP-A-0 069 563 "Semiconductor Laser Diode".

In each of the devices described in these documents, the bent-waveguide structure is obtained by growing the layered diode structure on a patterned substrate surface having a long horizontal mesa center region on which the active gain section of the waveguide is grown and, near its ends where the facets are later on to be cleaved or etched, short inclined regions or edges perpendicular to the longitudinal direction of the waveguide. The angle between horizontal and inclined surfaces is large enough to force the beam generated in the active waveguide section not to follow the bent waveguide but to proceed essentially undeflected through the (wider bandgap) surrounding material to the mirror facet.

With such NAM structures substantial performance improvements have been achieved in that the optical absorption at the facet can be largely reduced. However, the required long-time reliability at high-power output still has not been reached when relying on a NAM-structure alone. For etched mirror devices in particular, additional measures need to be taken to satisfactorily solve the heating problem.

For certain material systems such as GaAs/AlGaAs, the conductivity-type, p or n, of epitaxially grown layers depends on the crystallographic orientation of the substrate surface when an amphoteric dopant such as Si is being used. On structured surfaces having horizontal planar mesas and inclined adjacent regions, the material grown on planar regions will be of a first conductivity-type whereas the material above the inclined regions will be of the second conductivity-type, with p-n or n-p junctions formed in between. Devices can be designed to use these junctions to either allow or to prevent currents from flowing in the lateral direction.

Again, a variety of documents are known that describe the crystal-plane-dependent doping effect and some applications thereof. The following are believed to be representative of the state of the art:

Article "Lateral p-n Junction Formation in GaAs Molecular Beam Epitaxy by Crystal Plane Dependent Doping" by D. L. Miller (Appl. Phys. Lett., Vol. 47, No. 12, December 1985, pp. 1309-1311). - EP-A-0 261 262 "Transverse Junction Stripe Laser".

Article: "High-power Fundamental Mode AlGaAs Quantum Well Channeled Substrate Laser Grown by Molecular Beam Epitaxy" by H. Jaeckel, et al. (Appl. Phys. Lett. 55(11), Sep. 11, 1989, pp. 1059-1061).

In each of these publications, the described structures are deposited on a patterned substrate surface to obtain doping reversal in the semiconductor grown on inclined surface regions that are normally very short, forming an edge that runs parallel to the longitudinal direction of the waveguide eventually formed. This is in contrast to the device structures and substrate pattern disclosed in the earlier cited publications on NAM-structures, where the inclined surface regions or edges extend, in all instances, in a direction perpendicular to the active waveguide. Edges parallel to the waveguide are appropriate for the purposes for which the p-n junctions are being used: they serve to provide lateral current confinement over the length of the waveguide; they are not employed to prevent currents from flowing into the critical mirror facet regions of the laser device.

It would thus be desirable to provide a laser diode device that provides for reduction of optical power absorption, the elimination of lateral current flow towards the mirror facet region of the laser diode, and improved reliability.

SUMMARY OF THE INVENTION

It is a main object of the invention to provide a laser diode of greatly improved reliability and long lifetime at high optical output power.

Another object is to provide a structure "terminating" the active laser diode waveguide at the light-emitting facet with a wide-bandgap zone with substantially reduced carrier recombination centers.

Still another object is to provide a laser diode of a rather simple structure that can be fabricated using conventional easy-to-control processes and that fulfills the dual purpose of terminating the active waveguide with a wide-bandgap zone and of preventing injected lateral currents from flowing into the mirror facet zone.

The present invention is intended to meet these objectives and to remedy the deficiencies of known structures and techniques. Accordingly, a laser diode of the present invention comprises a layered structure, in which an active waveguide is formed by an active layer sandwiched in between upper and lower cladding layers of a bandgap that differs from that of the active layer, and is deposited on a substrate having a pattern that causes the waveguide to be bent near its ends, i.e., near the cleaved or etched facets of the completed laser device. The laser beam, generated in the active, planar waveguide section, leaves the waveguide at the bend, continuing substantially unabsorbed and undeflected through the wider bandgap cladding layer material towards the mirror facet. During the growth of the layered structure, an amphoteric dopant is used which causes a reversal of the conductivity type within the semiconductor material deposited above inclined surface regions. Thus, junctions serving as current blocks are formed.

By the simple means of providing a substrate having, near the facet planes, inclined surface regions or edges with an inclination angle that is sufficiently large to allow (1) the laser beam to leave the waveguide where it is bent, and (2) the conductivity type to change from n to p (or vice versa) due to the plane-dependent doping process used, one obtains, at the mirror facet, a substantial reduction in optical absorption and in the number of carriers available for non-radiative recombination.

The main advantages offered by the invention are that some of the major reliability problems encountered with diode lasers, particularly with etched mirror devices, are eliminated or at least largely reduced. This being power absorption and the injection of non-radiatively recombining carriers in the facet region, both normally causing mirror deterioration potentially resulting in catastrophic optical damage (COD). The inventive structure also lends itself to additional measures aimed at further performance improvement. An example being the use of a drain electrode for carrier withdrawal from the mirror facet region that is described as an optional feature of the embodiment of the invention described below.

DESCRIPTION OF THE DRAWINGS

The invention is described in detail below with reference to drawings which illustrate the underlying principles and specific embodiment of the invention, and in which.

DETAILED DESCRIPTION

Figure 1:
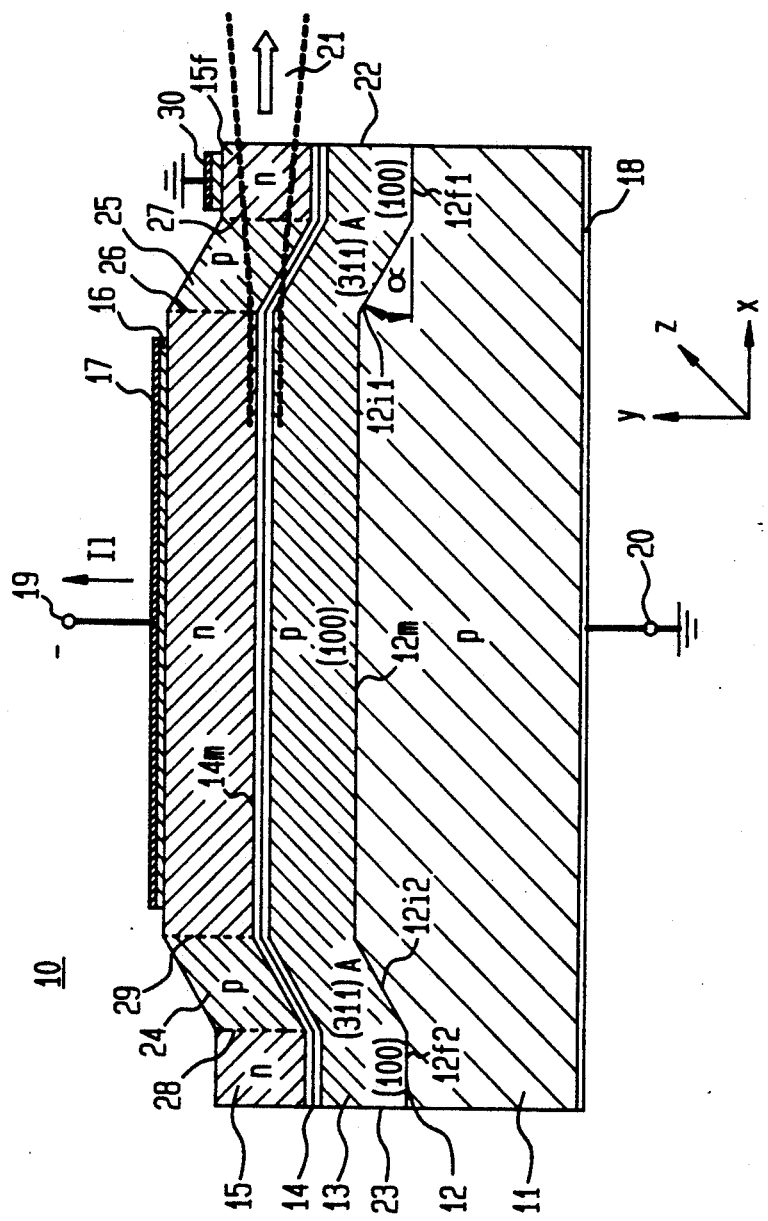
FIG. 1 is a schematic illustration of the basic structure and elements of the inventive diode laser.

Before describing an embodiment of the invention in greater detail, the basic concepts on which the invention is based will be outlined with reference to FIG. 1.

FIG. 1 is a schematic representation of a laser diode structure 10 (shown is a cut in the longitudinal direction) that is epitaxially grown on a (100)-oriented patterned substrate 11. Only the elements most essential for the explanation are shown in the figure. The waveguide 14 for generating the laser beam 21 runs parallel to the x-axis (see small insert), its lateral extension being in the z-direction. The substrate surface 12 consists of a (100) planar mesa region 12m "terminated" at both ends with inclined, (311)A-oriented transition regions 12i1 and 12i2 and adjoining planar regions 12f1 and 12f2 continuing to the facet surfaces 22 and 23 which may be cleaved or etched. In the figure, the stack of layers forming the laser device only comprises waveguide 14 and its associated cladding layers 13 and 15. Further layers that may be employed, e.g., buffer layers, are not shown to keep the figure simple. Waveguide 14 may consist of a quantum well structure with thin graded index layers at both sides but could equally well take any other form suitable to generate a laser beam. The stack is completed by adding electrode 18 at the bottom of the substrate and electrode 17 deposited at the top on a highly conductive contact layer 16.

In the illustrated arrangement, the substrate 11 and the layers beneath the waveguide 14 are indicated by the letter "p" as being of p-type conductivity whereas the semiconductor layers above the waveguide are of the n-conductivity type. For laser operation, the p-n junction formed at the waveguide 14 is forward biased by applying a voltage of a polarity as indicated, i.e., the bottom electrode is grounded via terminal 20 whereas top electrode 17 is connected to a source 19 of negative potential. When a laser current Il, flowing through the device in the direction perpendicular to the planes of the layers, exceeds the threshold current Ith of the device, laser beam 21 is generated and emitted. The bent-waveguide structure of FIG. 1 provides for two features which, together, substantially improve device performance, particularly its high-power reliability.

Firstly, with a bent waveguide 14, the inclination angle α of transition regions 11i1 and 11i2 being about 20 degrees or larger, beam 21 generated in the gain section 14m of the waveguide will not "follow" the bent waveguide but proceed substantially unaffected in the direction of the gain section to leave the device through the facet section 15f of cladding layer 15 at mirror facet 22.

The positive effect achieved with the bent waveguide, if properly "terminated" with respect to the dimensions of the window structure (e.g., length of sections 12i and 12f, angle α) and to the band gap energy relation between cladding layer and waveguide material, is that the beam leaves the device through higher bandgap material whereby the optical absorption and thus heat development are greatly reduced. In other words, the device has non-absorbing mirror (NAM) sections providing for the known, inherent advantages.

Since beam 21 is unguided while travelling through the cladding layer, one might expect an increase in required threshold current Ith for laser operation. Measurements have, however, proven that neither the threshold current value nor the far-field beam pattern or other performance characteristics of the device are severely affected provided the distance from the bend to the mirror facet is not longer than 10 to 15 μm for a typical set of layer thicknesses.

The second important feature of the device shown in FIG. 1 is the fact that the material of the inclined upper cladding layer 15 grown over inclined substrate surface regions 12i1 and 12i2, is of p-type conductivity whereas the remainder of that cladding layer is of n-type conductivity. This is due to the plane-dependent doping effect: when using an amphoteric dopant such as Si during epitaxial growth, the resulting doping of e.g. GaAs layers may depend on the crystallographic orientation of the substrate surface on which the layers are grown. In the example of FIG. 1, the layers are grown on horizontal (100) substrate surfaces and on inclined (311)A surfaces. As a result, inclined sections 24 and 25 of upper cladding layer 15 are p-conducting whereas the horizontal sections of this layer are of n-conductivity. Thus n-p junctions 26 and 29 as well as p-n junctions 27 and 28 are automatically created. The latter junctions play an important role in the operation of the device in that they block current injected at electrode 17 from flowing into the mirror section 15f where injected carriers would otherwise increase the heat developed at the unavoidable facet surface states.

The two described features "non-absorbing mirror" and "p-n junctions serving as current block" are obtained with a simple device that can easily and reliably be fabricated using conventional process steps by simply growing the device on a structured substrate with (100) and (311)A oriented surface regions and by using an amphoteric dopant such as Si in a GaAs/AlGaAs system.

Due to the combined effect, there is a substantial performance improvement over devices using any known NAM structure alone. The added advantages are achieved by the current blocking effect obtained by applying the plane-dependent doping technique which was known per se but which has, in laser technology, to our knowledge only been used for lateral current confinement, where the inclined surface providing for the current blocking junctions needs to run parallel to the waveguide (in the x-direction) rather than perpendicular thereto (in the z-direction) as required in the inventive device.

Further performance improvement can be obtained when connecting an additional drain electrode 30 to the n-conductivity facet section 15f of upper cladding layer 15 as shown in FIG. 1. To guarantee proper operation, this electrode must not overlap and thus shorten p-n junction 27 nor should it extend completely to the facet surface 22 in order to avoid any electrical connection to the coating later on applied to the facet. Grounding the additional electrode leads to complete depletion of carriers from the critical facet region.

Figures 2A, 2B:
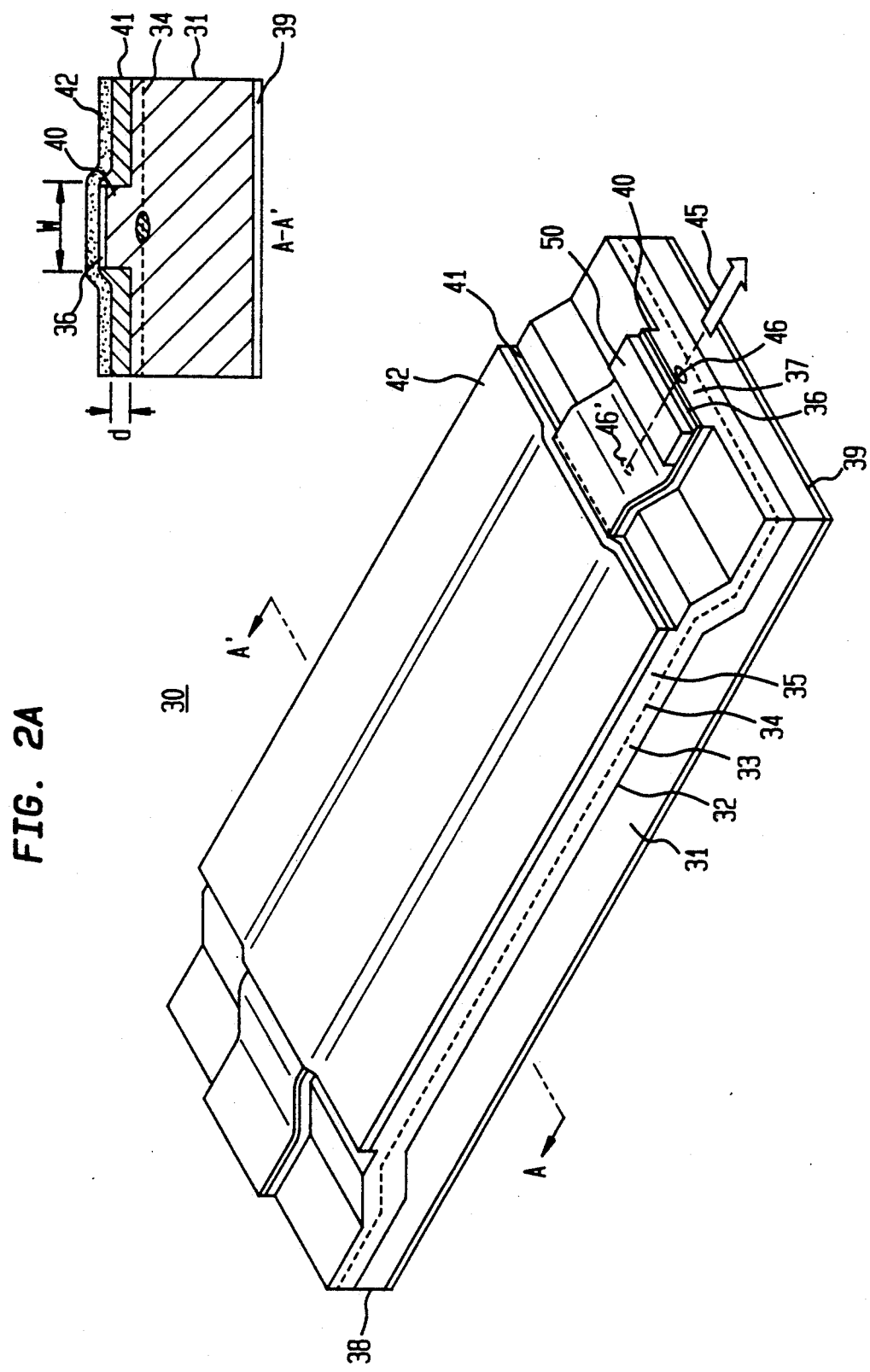
FIG. 2A is a perspective view of an embodiment of an inventive laser device in the form of a ridge QW GRINSCH structure in GaAs/AlGaAs technology grown in a Molecular Beam Epitaxy (MBE) process.
FIG. 2B is a cross-section of the embodiment illustrated in FIG. 2A.

A specific embodiment of the inventive laser diode, based on GaAs/AlGaAs technology and designed in accordance with the principles just described, is illustrated in FIGS. 2A and 2B showing the essential elements of a ridge Quantum Well GRINSCH laser (Graded Refractive Index Separate Confinement Heterostructure), where one or more quantum wells (QW) serve as active layer. The QWs are sandwiched between AlGaAs layers of graded Al-content whereby the refractive index in the material adjacent to the active QW layer is gradually changed. This allows electrical and optical confinement in the waveguide to be optimized independent from each other. Such a GRINSCH structure has e.g. been described in an article "High-Power Ridge Waveguide AlGaAs GRINSCH Laser Diode" by C. Harder, et al., published in Electronics Letters Sep. 25, 1986, Vol. 22, No. 20, pp. 1081–1082.

The laser device 30 illustrated in FIGS. 2A and 2B is structured applying the same principles as those explained in connection with FIG. 1. Substrate 31 consists of (100) p-GaAs, its surface 32 being patterned as shown in the figure, i.e., it forms a horizontal planar mesa having, at both ends, an inclined transition section or edge followed by a vertically displaced horizontal facet section. The vertical displacement between the planar mesa and the facet sections is about 1 μm. The transition surfaces essentially correspond to a (311)A plane, their slope or angle of inclination being about 28°, their length about 2 μm. The length of the mesa region determines the length of the gain section of the completed laser structure. It needs to be in the order of 350 to 750 μm, depending on the application of the device. The length of the horizontal facet sections is about 5 μm. Together with the inclined transition region, the terminating window should not be longer than 10 to 15 μm to avoid an undesirably large increase in the threshold current of the device or a distortion of the far filed pattern of the emitted beam.

The mesa pattern of the substrate surface 32 on which the layered structure of the inventive laser is grown can be obtained on a (100) GaAs crystal surface using standard photolithography and a $NH_3$:$H_2O_2$: $H_2O$ (10:2:100) etchant. The etch time determines the amount of displacement between the mesa and the facet sections. It can be predetermined with an accuracy of about ±10 nm.

The stack of semiconductor layers, comprising the lower (33) and upper (35) cladding layers with the GRINSCH waveguide structure 34 in between, is grown on the patterned substrate surface using a Molecular Beam Epitaxy (MBE) process; alternatively, a Chemical Beam Epitaxy (CBE) or a Metal Organic Chemical Vapor Deposition (MOCVD) technique can also be employed. To obtain the desired doping reversal in the inclined layer sections, an amphoteric dopant is used during epitaxial growth. When utilizing a MBE process, silicon (Si) is a suitable dopant.

The dotted line 34 in FIGS. 2A and 2B represents the quantum well GaAs waveguide and the adjacent graded Al-content AlGaAs layers of the laser.

In the specific embodiment, the stack of semiconductor layers grown on the substrate 31 comprises:

| | | |
|---|---|---|
| lower cladding layer 33 | | (p-$Al_xGa_{1-x}$As with x = 0.40; 1.8 μm thick), |
| graded index layer | ⎫ | (p-$Al_xGa_{1-x}$As with x = 0.40–0.18; 200 nm thick), |
| undoped QW layer | ⎬ 34 | (i-GaAs; 7 nm thick), |
| graded index layer | ⎭ | (n-$Al_xGa_{1-x}$As with x = 0.18–0.40; 200 nm thick), |
| upper cladding layer 35 | | (n-$Al_xGa_{1-x}$As with x = 0.40; 2.8 μm thick.), |
| contact layer 36 | | (n+$Ga_yIn_{1-y}$As with y = 0.5; 30 nm thick). |

The doping density of contact layer 36 is high enough for a non-alloyed electrode consisting of, e.g., titanium, platinum and gold to make good ohmic contact.

Processing the layered structure to form the ridge 40 can be relatively simple: A 5 μm-wide photoresist strip is placed on top of the contact layer 36 extending over the whole length of the stack to define the ridge. The ridge structure is then formed by etching 1 to 2 μm of the top layers (contact layer 36 and upper cladding layer 35) with a wet etch at room temperature ($H_2SO_4$:-$H_2O$:$H_2O$ = 1:8:1000). Etching is stopped 0.2 μm above the upper graded-index layer which results in good lateral mode confinement.

The photoresist is left on the ridge during the following sputter deposition of 100 nm $SiO_2$ (41). Then, the photoresist is removed lifting off the $SiO_2$ on the ridge and exposing the top of the n-type GaAs contact layer for contacting.

Using conventional processes, the ohmic contact electrodes 42 and 39 are applied as shown to the n+ contact layer 36 at the top of the layered structure and to the bottom of substrate 31, respectively. The top electrode is made of Ti/Pt/Au, the bottom electrode of Au/Ni/Zn. The optional drain electrode 50, also consisting of Ti/Pt/Au and having a length of about 1 to 2 μm can be deposited together with top electrode 42.

Next, the mirror facets are obtained either in a standard cleave process or by etching using a conventional process, an example being disclosed in published European Patent Application 0 363 547.

To complete the device, proper coatings, consisting e.g. of $Al_2O_3$, are applied in a conventional manner to the facets for passivation and protection and to determine the desired reflectivity.

When applying a proper voltage to the electrodes (for simplicity, connection pads are not shown in the figures) causing a current larger than the threshold current Ith to flow through the device, beam 45 will be emitted at mirror facet 37. The light mode regions at the facet and at the end of the active waveguide section are indicated by the two ellipses 46 and 46', respectively.

There has thus been provided a laser diode device which substantially reduces or even eliminates optical power absorption and high carrier densities at the laser facet. The laser diode of the present invention provides a novel combination of NAM-facet window structures and crystal plane-dependent doped junctions to achieve a desired performance improvement over prior know devices.

The invention has been described in detail as applied to a specific diode laser, i.e., a GaAs/AlGaAs QW GRINSCH ridge structure. It should, however, be understood that the invention is also applicable to other laser waveguide structures and that semiconductor materials other than AlGaAs may be used and various other modifications made. For example, the orientation of the inclined substrate regions need not to be (311)A; (111)A or (211)A are other suitable crystal surfaces. Also, a groove structure can be used instead of the mesa arrangement, i.e., the planar facet sections (15f) of the waveguide can be higher than the gain section rather than lower (FIG. 1). Furthermore, in fabricating the device, epitaxy processes other than MBE may be applied and, in general, process parameters, etchants and indicated thicknesses chosen for the described embodiment of the invention, may be changed without departing from the spirit of the invention.

What is claimed is:

1. A semiconductor laser diode, comprising:
   a) a semiconductor substrate having a structured surface thereon exhibiting planar and inclined surface regions; and
   b) a waveguide comprising an active layer sandwiched in between first and second cladding layers, said cladding layers being made of a material having a wider bandgap than that of the active layer material, said waveguide for generating a laser beam emitted at a mirror facet at one end of said waveguide, said waveguide further being deposited upon the structured surface of said semiconductor substrate whereby said active layer and said cladding layers comprise planar and inclined sections, wherein the planar and inclined sections of said active and said cladding layers:
   form an angle α with respect to each other of at least 20°, bending the waveguide in its longitudinal (x) direction near the mirror facet to form a bend, and further comprise
   sections grown with an amphoteric dopant whereby inclined sections of at least on one of said cladding layers are made to be of a conductivity type different from that of adjoining planar sections of that cladding layer thus forming at least one current blocking junction, such that the generated laser beam leaves the waveguide at the bend, continuing substantially unabsorbed through the higher-bandgap cladding layer material towards the mirror facet and the at least one junction formed in the cladding layer blocks current from flowing laterally towards the mirror facet.

2. The laser diode as claimed in claim 1, wherein the second cladding layer comprises a short planar facet section located between a respective inclined section and the mirror facet, the facet section being vertically displaced with respect to the second cladding layer section deposited above a mesa region of the substrate surface.

3. The laser diode as claimed in claim 2, further wherein an additional drain electrode is connected to the short planar facet section between said current blocking junction and said mirror facet of the second cladding layer for application of a potential for depleting carriers from the facet section.

4. The laser diode as claimed in claim 1, wherein an inclined section and a short planar section of the active and cladding layers form a waveguide-terminating structure having a total length of less than 15 μm.

5. The laser diode as claimed in claim 1, wherein said waveguide comprises a GaAs/AlGaAs structure.

6. The laser diode as claimed in claim 1, wherein said waveguide is fabricated using a molecular beam epitaxy (MBE) process.

7. The laser diode as claimed in claim 1, wherein the inclined sections of said active and said cladding layers of said waveguide are grown on (311)A surfaces of said substrate, and the planar sections of said active and said cladding layers of said waveguide are grown on (100) surfaces of said substrate.

8. The laser diode as claimed in claim 1, wherein the amphoteric dopant used during growth of said active and said cladding layers forming the device is silicon (Si).

* * * * *